United States Patent [19]
Hayashi

[11] Patent Number: 5,776,804
[45] Date of Patent: Jul. 7, 1998

[54] PROCESS OF FABRICATING SEMICONDUCTOR DEVICE HAVING NON-SINGLE CRYSTAL THIN FILM TRANSISTOR FREE FROM RESIDUAL HYDROGEN LEFT THEREIN DURING HYDROGEN TREATMENT STAGE

[75] Inventor: Fumihiko Hayashi, Tokyo, Japan

[73] Assignee: NEC Corporation, Japan

[21] Appl. No.: 736,933

[22] Filed: Oct. 25, 1996

[30] Foreign Application Priority Data

Oct. 31, 1995 [JP] Japan .................. 7-282955

[51] Int. Cl.⁶ .................. H01L 21/00; H01L 21/322
[52] U.S. Cl. .................. 438/162; 438/475; 438/798
[58] Field of Search .................. 438/486, 162, 438/475, 798

[56] References Cited

U.S. PATENT DOCUMENTS

| | | | |
|---|---|---|---|
| 4,309,259 | 1/1982 | Sarma et al. | 204/162 |
| 5,112,764 | 5/1992 | Mitra et al. | 437/40 |
| 5,250,444 | 10/1993 | Khan | 438/162 |
| 5,470,763 | 11/1995 | Hamada | 428/162 |
| 5,508,227 | 4/1996 | Chan et al. | 437/172 |
| 5,627,085 | 5/1997 | Gosain | 438/162 |

FOREIGN PATENT DOCUMENTS 6-44573  6/1994  Japan .................. H01L 21/336

OTHER PUBLICATIONS

D.P. Gosain, et al., "High Performance Bottom Gate TFT by Excimer Laser Crystallization and Post Hydrogenation," Jpn. J. Appl. Phys. Part I No. 2B vol. 34, pp. 937–941, Feb. 1995.

*Primary Examiner*—John Niebling
*Assistant Examiner*—Michael S. Lebentritt
*Attorney, Agent, or Firm*—Hayes, Soloway, Hennessey, Grossman & Hage, P.C.

[57] ABSTRACT

A thin film transistor formed on a non-single crystal silicon layer is exposed to hydrogen ion radiated from hydrogen plasma at 300 degrees to 400 degrees centigrade so as to deactivate trapping levels in the non-single crystal silicon layer, and, thereafter, the thin film transistor is annealed in nitrogen atmosphere at 200 degrees to 300 degrees centigrade so as to evacuate residual hydrogen from, for example, a gate insulating layer, thereby improving the transistor characteristics of the thin film transistor.

13 Claims, 14 Drawing Sheets

PROCESS OF FABRICATING SEMICONDUCTOR DEVICE HAVING NON-SINGLE CRYSTAL THIN FILM TRANSISTOR FREE FROM RESIDUAL HYDROGEN LEFT THEREIN DURING HYDROGEN TREATMENT STAGE

FIELD OF THE INVENTION

This invention relates to a process of fabricating a semiconductor device and, more particularly, to a process of fabricating a semiconductor device having a thin film transistor formed on a non-single crystal silicon layer free from residual hydrogen left in the thin film transistor during a treatment stage with hydrogen plasma.

DESCRIPTION OF THE RELATED ART

Amorphous- and polycrystalline structure are categorized in non-single crystal structure opposite to single-crystal structure, and non-single crystal semiconductor material is used for a thin film transistor serving as a load element of a static random access memory cell and an active switching element of a liquid crystal display unit. Research and development efforts have been made on the thin film transistor fabricated on the non-single crystal semiconductor layer, and integrated circuit devices equipped with the thin film transistors are recently introduced to the semiconductor device market. The thin film transistor fabricated on a non-single crystal semiconductor layer is hereinbelow referred to as "non-single crystal thin film transistor".

One of the attractive features of the non-single crystal thin film transistor is to be easily fabricated on an inter-level insulating layer (or an interlayer dielectric film) over a single crystal semiconductor substrate or an insulating substrate such as quartz or glass. However, the non-single crystal thin film transistor has suffered from drawbacks such as a large amount of trap level in the non-single crystal semiconductor layer, a large amount of surface trap level between the non-crystal semiconductor layer and the gate insulating layer, a large amount of leakage current, the large threshold and the low carrier mobility, and is, accordingly, inferior in transistor characteristics to a bulk transistor fabricated on a single crystal semiconductor substrate. These drawbacks are due to dangling bonds and crystal defects unavoidably generated in the non-single crystal semiconductor structure.

One of the approaches to improve the properties of the non-single crystal semiconductor material is proposed in Japanese Patent Publication of Examined Application No. 6-44573, and the Japanese Patent Publication of Examined Application proposes to treat the non-single crystal semiconductor layer with plasma containing hydrogen. The hydrogen is bonded to the trap level, and deactivates it. The process proposed in the Japanese Patent Publication of Unexamined Application is hereinbelow described in detail.

FIG. 1 illustrates the basic concept of the process disclosed in the Japanese Patent Publication of Examined Application. The axis of coordinates represents the temperature of hydrogen plasma, and the abscissa stands for time for treating a non-single crystal silicon layer with the hydrogen plasma. The treatment with the hydrogen plasma is carried out after completion of a non-single crystal thin film transistor, and the plasma is created through a hydrogen discharge.

A non-single crystal silicon layer is deposited on an insulating layer, and is partially covered with a gate insulating layer. A gate electrode is formed on the gate insulating layer, and a dopant impurity is selectively introduced into the non-single crystal silicon layer so as to form source and drain regions in a self-aligned manner with the gate electrode. The part of the non-single crystal silicon layer under the gate electrode serves as a channel forming layer. Thus, a non-single crystal thin film transistor is fabricated on the non-single crystal silicon layer.

When the non-single crystal thin film transistor is completed, the manufacturer places the non-single crystal thin film transistor in a high-frequency induction reactor, and gaseous mixture of hydrogen and helium is introduced into the high-frequency induction reactor. The hydrogen pressure is regulated to $10^{-1}$ mmHg to 10 mmHg. Alternating current is applied to the high-frequency induction reactor, and is regulated to 1 MHz to 20 MHz. The hydrogen discharge takes place in the high-frequency induction reactor, and the non-single crystal thin film transistor is exposed to hydrogen plasma at 300 degrees to 500 degrees centigrade for 5 minutes to 60 minutes. Then, the hydrogen is bonded to the trap level in the non-single crystal silicon layer, and improves the transistor characteristics of the non-single crystal thin film transistor. When the time is expired, the non-single crystal thin film transistor is quenched to room temperature in the hydrogen discharge, and the quench prevents the non-single crystal silicon layer from liberation of the hydrogen.

The Japanese Publication of Unexamined Application further teaches that the alternating current of the order of 1000 MHz or a micro-wave is available for the hydrogen discharge.

However, the prior art process encounters a problem in that the residual hydrogen deteriorates the non-single crystal thin film transistor and bulk transistors, if any. In detail, while the non-single crystal thin film transistor is being exposed to the hydrogen plasma, the hydrogen atoms are introduced into not only the non-single crystal silicon layer but also the gate insulating layer, an insulating layer under the non-single crystal silicon layer and an inter-level insulating layer covering the thin film transistor. When the non-single crystal thin film transistor is quenched to the room temperature, the hydrogen is left in these insulating layers at high density. The high-dense hydrogen is movable in the insulating layers. In fact, while the insulating layers are being heated in the later stages, the hydrogen moves in the gate insulating layer, and changes the transistor characteristics of the non-single crystal thin film transistor. When an electrical stress is applied thereto, the hydrogen moves in the gate insulating layer, and undesirably changes the transistor characteristics.

If the non-single crystal thin film transistors serve as load elements of a flip-flop type static random access memory cell, bulk transistors are formed as the driver and access transistors of the static random access memory cell under the load element, and an inter-level insulating layer is inserted between the bulk transistors and the non-single crystal thin film transistors. The residual hydrogen moves in the inter-level insulating layer, and affects the bulk transistors. Thus, the residual hydrogen affects not only the non-single crystal thin film transistors but also the bulk transistors, and changes the transistor characteristics thereof. If the inter-level insulating layer is formed of boro (hyphen) phosphosilicate glass, the residual hydrogen seriously affects the bulk transistors.

SUMMARY OF THE INVENTION

It is therefore an important object of the present invention to provide a process of fabricating a semiconductor device which does not change transistor characteristics of a non-single crystal thin film transistor treated with hydrogen.

The present inventor contemplated the problem inherent in the prior art process, and made researches on the diffusion/bond/elimination process of the hydrogen. The present inventor found the following facts.

The higher the temperature was, the faster the hydrogen moved. Especially, the hydrogen activated in the plasma freely moved in the non-single crystal semiconductor layer at 300 degrees centigrade or more.

The bonding process between the hydrogen and the trap level became majority at 300 degrees centigrade or less, and, on the contrary, the elimination process was the majority at 400 degrees centigrade or more.

The elimination of hydrogen from the trap level was active under vacuum rather than under the atmospheric pressure.

The present inventor reached the first conclusion that the hydrogen treatment between 300 degrees and 400 degrees achieved the deactivation of the trap level under a fast diffusion without the elimination.

The second conclusion was that a post-heat treatment between 200 degrees to 300 degrees in centigrade or a slow cooling decreased the residual hydrogen through the diffusion from the insulating layers to the outside and/or the non-single crystal silicon layer. When the heat treatment or the slow cooling was carried out under the atmospheric pressure, the hydrogen was prevented from the elimination from the trap level, and the heat treatment or the slow cooling enhanced the deactivation of the trap level in the hydrogen plasma.

To accomplish the object, the present invention proposes to evacuate residual hydrogen from a non-single crystal thin film transistor at 200 degrees to 300 degrees centigrade.

In accordance with the present invention, there is provided a process of fabricating a semiconductor device, comprising the steps of: a) preparing a structure having an upper surface covered with a first insulating layer; b) fabricating a thin film transistor having a non-single crystal semiconductor layer extending on the first insulating layer; c) completing a semiconductor structure having at least a second insulating layer covering the thin film transistor; d) exposing the semiconductor structure to hydrogen ion radiated from a plasma created from gaseous mixture containing hydrogen at 300 degrees to 400 degrees centigrade so as to deactivate trapping levels in the non-single crystal semiconductor layer; and e) evacuating residual hydrogen from the semiconductor structure except for the non-single crystal semiconductor layer at 200 degrees to 300 degrees centigrade.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENTS

First Embodiment

Referring to FIGS. 2A to 2G of the drawings, a process embodying the present invention starts with preparation of a p-type single crystal silicon substrate 10, and circuit components such as n-channel enhancement type bulk transistors (not shown) are fabricated on active areas of the p-type single crystal silicon substrate 10 defined by a field oxide layer. The n-channel enhancement type bulk transistors form parts of an integrated circuit.

Insulating material such as silicon oxide is deposited over the entire surface of the p-type single crystal silicon substrate 10, and forms a lower inter-level insulating layer 11 of 100 nanometers to 1000 nanometers thick. An insulating substrate such as a quartz substrate is available for the process instead of the p-type single crystal silicon substrate 10 covered with the lower inter-level insulating layer 11. In this instance, the lower inter-level insulating layer 11 serves as a first insulating layer.

Figure 1:
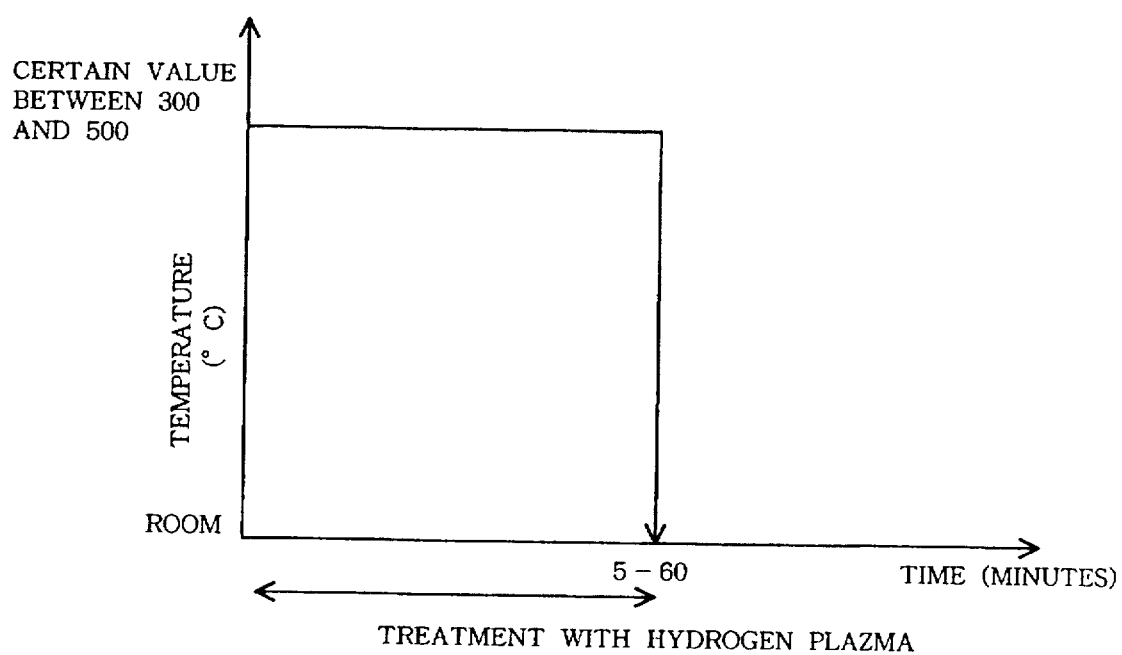
FIG. 1 is a graph showing the treatment with the hydrogen plasma carried out in the prior art process of fabricating a semiconductor device.
Figure 2A:
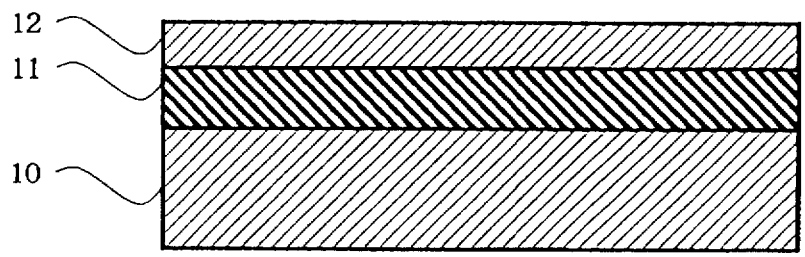
FIG. 2A to 2G are schematic cross sectional views showing a process of fabricating a semiconductor device according to the present invention.

Subsequently, amorphous silicon is deposited to 10 nanometers to 100 nanometers thick over the lower inter-level insulating layer 11 by using a low-pressure chemical vapor deposition, and the amorphous silicon layer is heated to 600 degrees centigrade so as to laminate a polysilicon layer 12 on the lower inter-level insulating layer 11. The polysilicon layer 12 is patterned through lithographic techniques and a dry etching. The resultant semiconductor structure is shown in FIG. 2A.

N-type dopant impurity such as phosphorous is ion implanted into the polysilicon layer 12, and the dopant concentration of the polysilicon layer 12 is regulated to $10^{16}$ $cm^{-3}$ to $10^{18}$ $cm^{-3}$. The n-type dopant concentration is dependent on the threshold voltage of a non-single crystal thin film transistor, and the non-single crystal thin film transistor may not require an ion-implantation.

The polysilicon layer 12 is thermally oxidized, and a silicon oxide layer 13 of 5 to 50 nanometers thick is formed on the polysilicon layer 12. The silicon oxide layer 13 may be deposited on the polysilicon layer 12 by using a low-pressure chemical vapor deposition.

Figure 2B:
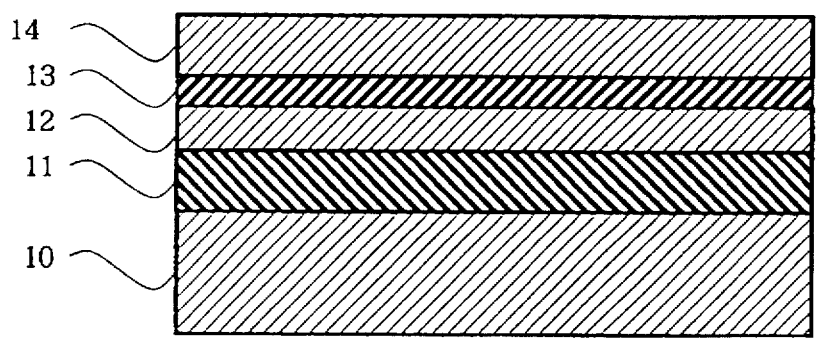

Polysilicon is deposited to 100 to 300 nanometers thick over the silicon oxide layer 13 by using a low-pressure chemical vapor deposition, and a polysilicon layer 14 is laminated on the silicon oxide layer 13 as shown in FIG. 2B. Dopant impurity such as phosphorous or boron is introduced into the polysilicon layer 14 by using a thermal diffusion or an ion-implantation.

Photo-resist solution is spun onto the doped polysilicon layer 14, and is dried and baked so as to form a photo-resist layer (not shown). A pattern image is optically transferred from a photo-mask (not shown) to the photo-resist layer for a gate electrode, and a latent image for the gate electrode is formed in the photo-resist layer. When the latent image is developed, the photo-resist layer is patterned so as to leave a photo-resist etching mask (not shown) on the doped polysilicon layer 14. Using the photo-resist etching mask, the doped polysilicon layer 14 is patterned into a gate electrode 14a on the silicon oxide layer 13 by using a dry etching technique.

Figure 2C:
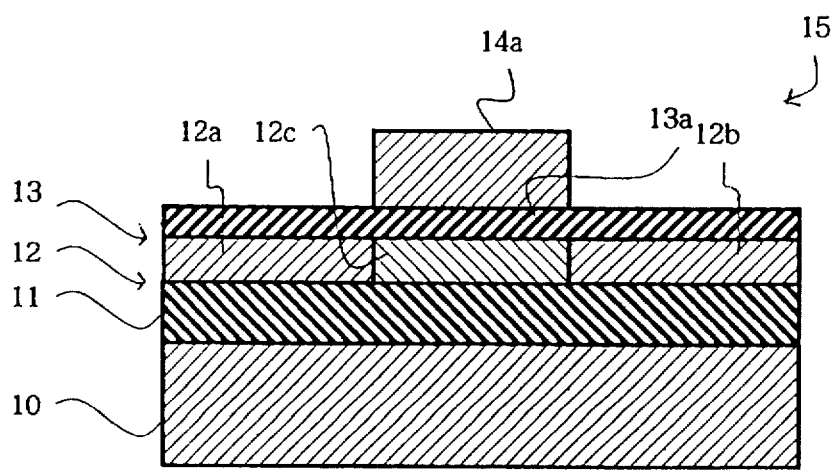

Using the gate electrode 14a as an ion-implantation mask, p-type dopant impurity such as boron is ion implanted through the silicon oxide layer 13 into the polysilicon layer 12, and a p-type source region 12a and a p-type drain region 12b are formed in the doped polysilicon layer 12 in a self-aligned manner with the gate electrode 14a as shown in FIG. 2C. The conditions of ion-implantation are regulated in such a manner that the p-type source region 12a and the p-type drain region 12b range $10^{19}$ cm$^{-3}$ to $10^{21}$ cm$^{31\ 3}$. The n-type polysilicon area is left under the gate electrode 14a, and serves as a p-type channel region 12c. The part of the silicon oxide layer 13 serves as a gate insulating layer, and the gate insulating layer is labeled with 13a. The p-type source region 12a, the p-type drain region 12b, the n-type channel region 12c, the gate insulating layer 13a and the gate electrode 14a as a whole constitute a non-single crystal thin film transistor 15.

Side-wall spacers may be formed on both side surfaces of the gate electrode 14a so as to form the p-type source region 12a and the p-type drain region 12b into the LDD (Lightly Doped Drain) structure through a second ion-implantation.

Insulating substance is deposited to 200 nanometers to 500 nanometers thick so that an inter-level insulating layer 16 covers the non-single crystal thin film transistor 15. The inter-level insulating layer 16 does not contain impurity in at least a lower portion held in contact with the non-single crystal thin film transistor 15. The inter-level insulating layer 16 serves as a second insulating layer.

Subsequently, the resultant structure is heated to 800 degrees to 1100 degrees centigrade. The inter-level insulating layer 16 is reflowed so as to improve the step coverage, and the dopant impurity in the source and drain regions 12a/12b is activated.

Figure 2D:
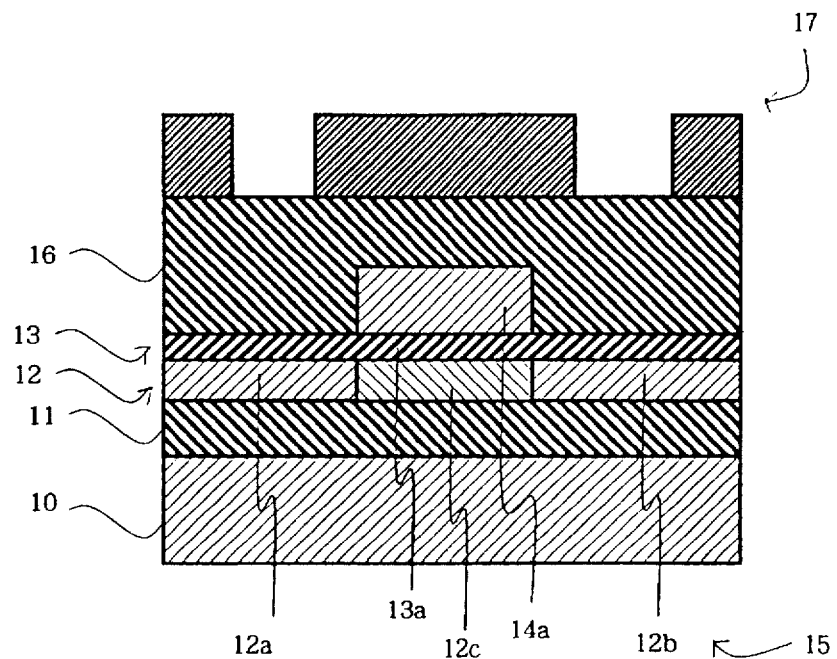

Photo-resist solution is spun onto the inter-level insulating layer 16, and is dried and baked so as to form a photo-resist layer (not shown). A pattern image is optically transferred from a photo-mask (not shown) to the photo-resist layer for contact holes, and a latent image for the contact holes is formed in the photo-resist layer. When the latent image is developed, the photo-resist layer is patterned so as to leave a photo-resist etching mask 17 on the inter-level insulating layer 16 as shown in FIG. 2D.

Using the photo-resist etching mask 17, the inter-level insulating layer 16 is partially etched away through a dry etching technique, and, accordingly, contact holes 18a and 18b are formed in the inter-level insulating layer 16. The p-type source region 12a and the p-type drain region 12b are exposed to the contact holes 18a and 18b, respectively. The photo-resist etching mask 17 is stripped off after the formation of the contact holes 18a/18b.

Figure 2E:
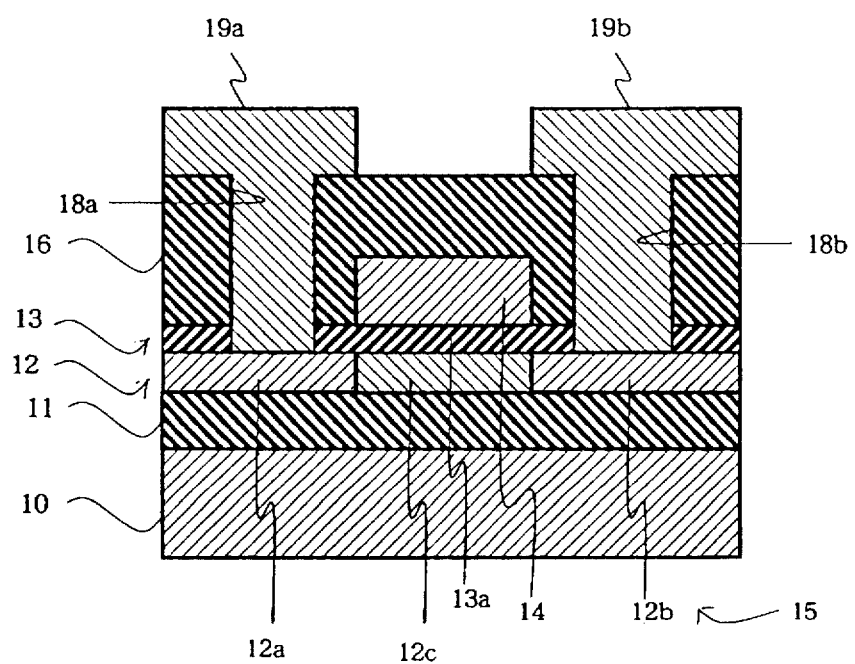

Metal such as aluminum or aluminum alloy is deposited over the entire surface of the resultant structure. The metal fills the contact holes 18a/18b, and swells into a metal layer over the inter-level insulating layer 16. A photo-resist etching mask (not shown) is provided on the metal layer, and the metal layer is partially etched away so as to leave metal wiring strings 19a and 19b as shown in FIG. 2E. The metal wiring strips 19a and 19b are respectively held in contact with the p-type source region 12a and the p-type drain region 12b, and form parts of a wiring arrangement incorporated in the integrated circuit together with the non-single crystal thin film transistor 15.

The metal wiring strips 19a/19b may be covered with a passivation film so as to complete a semiconductor device before a hydrogen treatment.

The resultant semiconductor structure shown in FIG. 2E is placed in a reaction chamber 20a defined in a reactor 20b of a diode parallel plate plasma chemical vapor deposition system 20, and a hydrogen treatment is carried out by using the diode parallel plate plasma chemical vapor deposition system 20.

The reactor 20b is accompanied with various equipments. The diode parallel plate plasma chemical vapor deposition system 20 further includes a suceptor 20c, a gas supply sub-system 20d, a vacuum pump 20e, a high-frequency induction heating sub-system 20f and a plasma generator 20g. The resultant semiconductor structure shown in FIG. 2E is mounted on the suceptor 20c, and the suceptor 20c can heat the semiconductor structure between 100 degrees to 500 degrees centigrade. The gas supply sub-system 20d is connected to gas inlet ports 20h, and supplies gaseous mixture or gas to the reaction chamber 20a. A gas passage 20i is formed in the suceptor 20c, and is open to the reaction chamber 20a. The gas passage 20i is connected to the vacuum pump 20e, and the vacuum pump 20e and the gas supply sub-system 20d maintain the reaction chamber at a target pressure. The high-frequency induction heating sub-system 20f heats up the reaction chamber 20a, and the plasma generator generates a hydrogen plasma PLZ from hydrogen gas.

Figure 3:
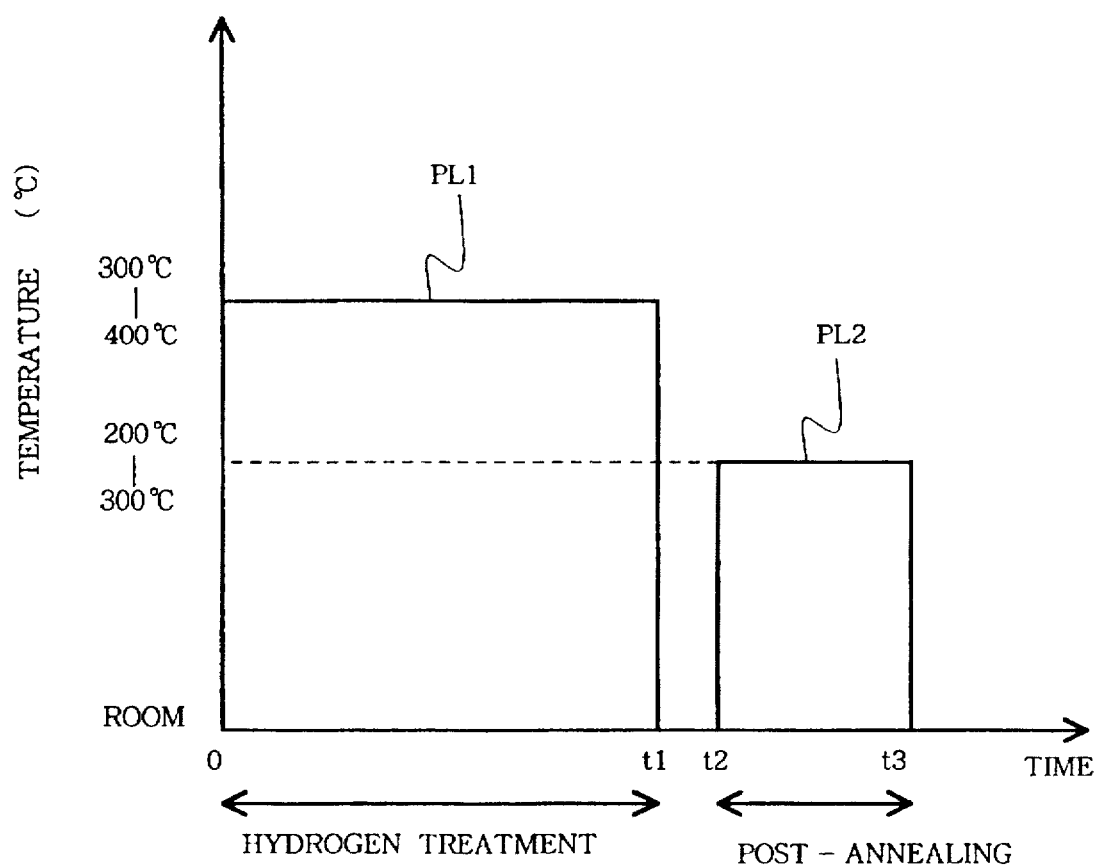
FIG. 3 is a graph showing a hydrogen treatment and a post annealing of the process according to the present invention.

The hydrogen treatment is carried out as indicated by plots PL1 of FIG. 3. First, the vacuum pump 20e evacuates the air from the reaction chamber 20a, and gaseous mixture GAS1 is supplied from the gas supply sub-system 20d to the reaction chamber 20a. Hydrogen gas H$_2$ and helium gas He form the gaseous mixture. In this instance, the gaseous mixture GAS1 contains hydrogen at 30 percent by volume. Alternatively, ammonia gas is available for the hydrogen treatment.

Figure 2F:
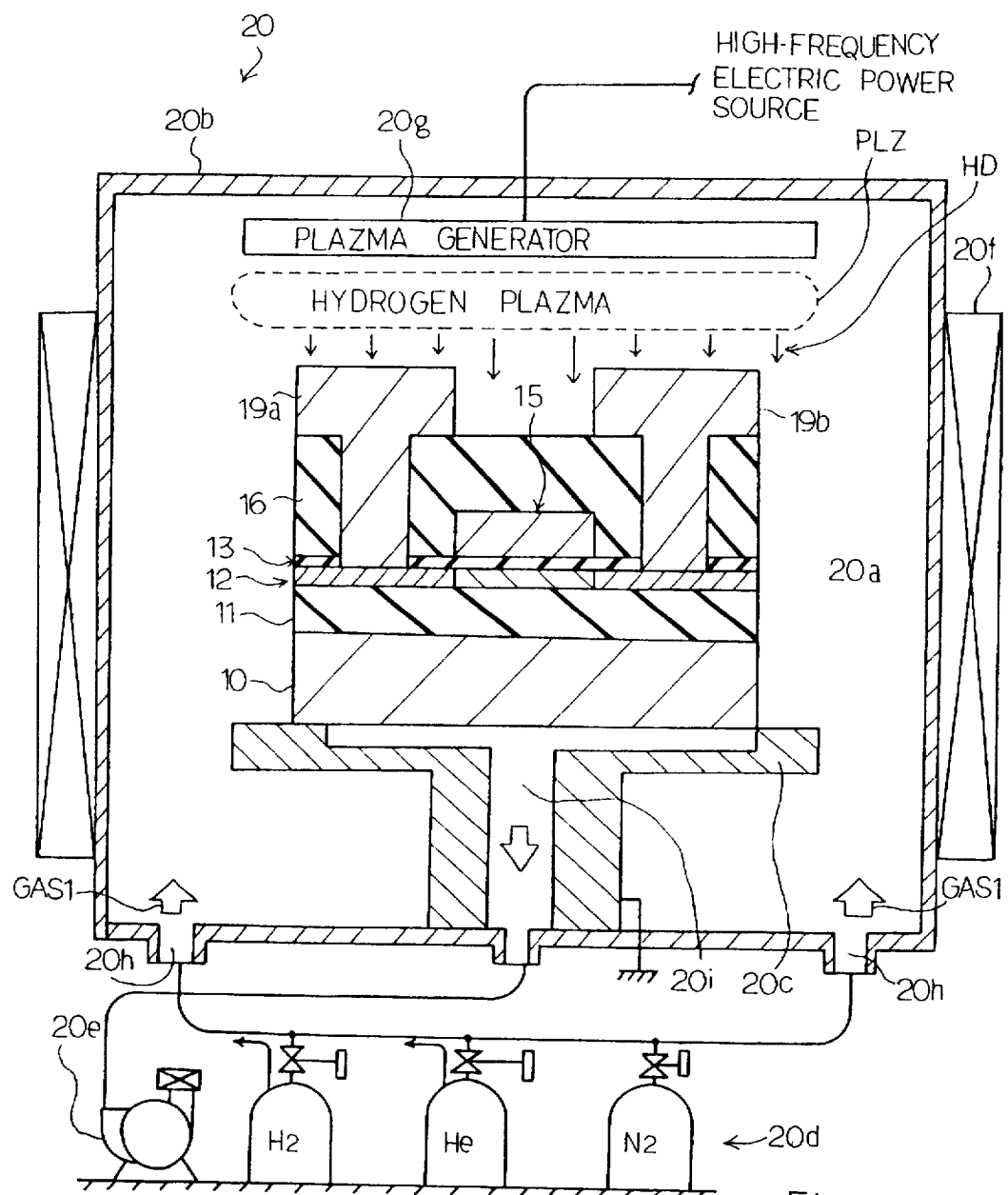

The gas supply sub-system 20d and the vacuum pump 20e regulates the gaseous mixture in the reaction chamber to a predetermined range, and the partial pressure of hydrogen is adjusted to 50 Pa. The high-frequency induction heating sub-system 20f heats the reaction chamber 20a in the vicinity of the semiconductor structure at 300 degrees to 400 degrees in centigrade, and the suceptor 20c also heats the semiconductor structure to the same temperature range. High frequency electric power at 13.56 MHz is supplied to the plasma generator 20g, and the plasma generator 20g creates the hydrogen plasma PLZ from the hydrogen gas of the gaseous mixture GAS1 as shown in FIG. 2F. While the hydrogen plasma PLZ is being created, the temperature of the suceptor 20c appropriately heats the semiconductor structure. Hydrogen ion HD is radiated to the semiconductor structure, and the semiconductor structure is exposed to the hydrion HD for 5 minutes to 120 minutes. The hydrogen ion moves through the inter-level insulating layer 16 and the silicon oxide layer 13, and the hydrogen ion deactivates trap levels in the non-single crystal silicon layer 12. The time period for the hydrogen treatment is expired at time t1 (see FIG. 3), and the reaction chamber is rapidly cooled to room temperature.

Figure 2G:
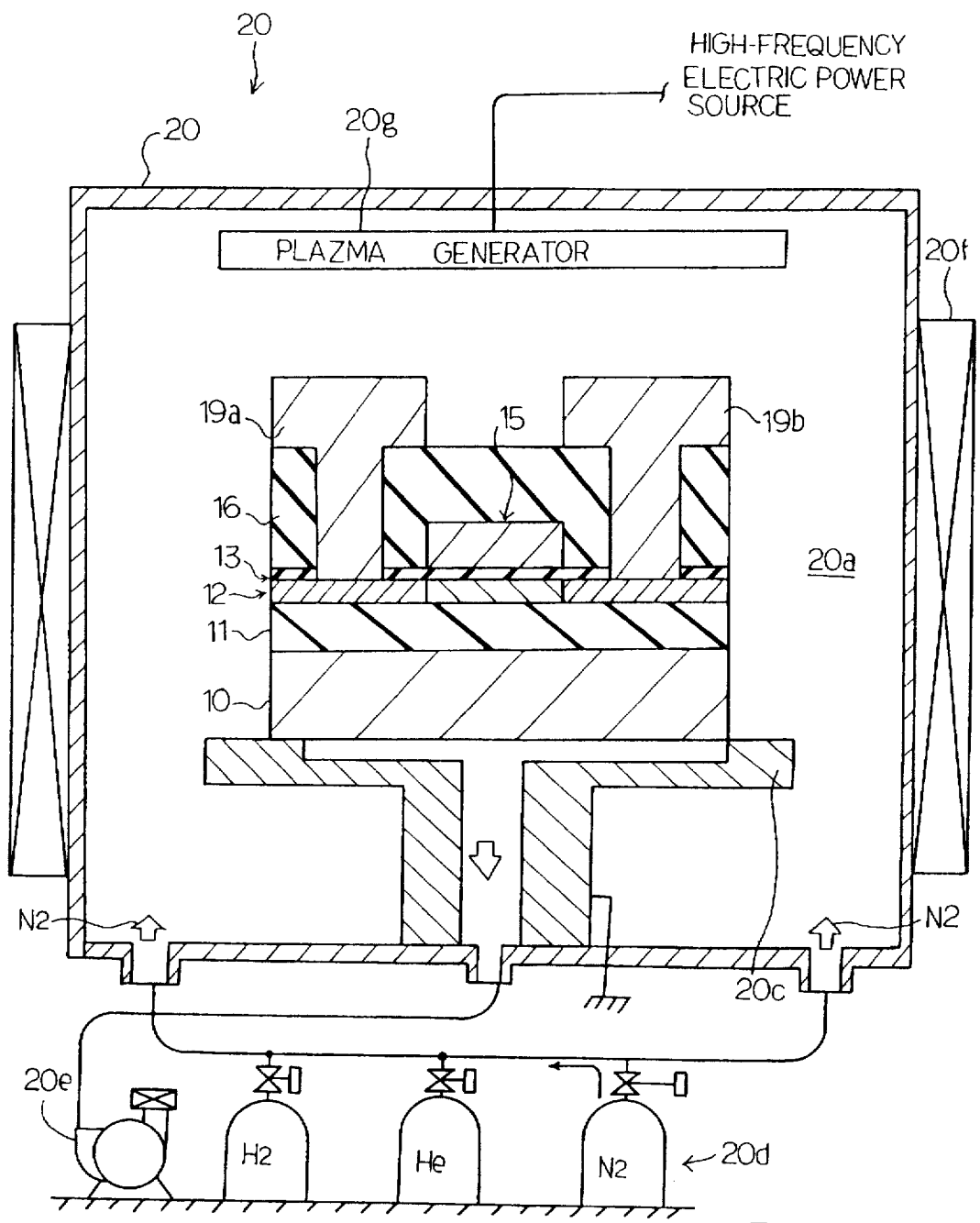

After the hydrogen treatment, the semiconductor structure is subjected to a post-annealing indicated by plots PL2 in FIG. 3. The gas supply sub-system 20d supplies nitrogen gas N$_2$ to the reaction chamber 20a as shown in FIG. 2G, and the reaction chamber 20a around the semiconductor structure is heated to 200 degrees to 300 degrees in centigrade for 5 minutes to 120 minutes. It is preferable to regulate the nitrogen in the reaction chamber 20a to the atmospheric pressure.

While the high-frequency induction heating sub-system 20f is heating the semiconductor structure, residual hydrogen is evacuated from the semiconductor structure except for the non-single crystal silicon layer 12. The residual hydrogen is partially diffused into the non-single crystal silicon layer 12, and is, by way of example, bonded to dangling bonds forming the trap levels and the surface state. Thus, the post-annealing further decreases the trap levels and the surface state of the non-single crystal silicon layer 12. The residual hydrogen is further evacuated from the semiconductor structure to the nitrogen $N_2$. However, the hydrogen is hardly eliminated from the non-single crystal silicon layer 12 by virtue of the temperature range between 200 degrees to 300 degrees centigrade.

When the time period for the post-annealing is expired, the reaction chamber 20a is rapidly cooled to the room temperature. The semiconductor structure is covered with a passivation layer so as to complete a semiconductor device.

The present inventor evaluated the post-annealing. The non-single crystal thin film transistors were fabricated through the process described hereinbefore. The hydrogen treatment was carried out at 350 degrees centigrade. One of the non-single crystal thin film transistor was not annealed after the hydrogen treatment, and the other non-single crystal thin film transistors were annealed at different temperatures between 100 degrees to 400 degrees centigrade for 60 minutes.

The drain voltage was adjusted to −3.3 volts, and the ground voltage was applied to the gate electrodes and the source nodes of the non-single crystal thin film transistors. The drain current was measured for each non-single crystal thin film transistor, and was plotted in FIG. 4.

Subsequently, although the drain nodes were also applied with −3.3 volts, the gate electrodes were adjusted to −3.3 volts, and the source nodes were grounded. The drain current was measured, again, and was plotted in FIG. 5.

Figure 4:
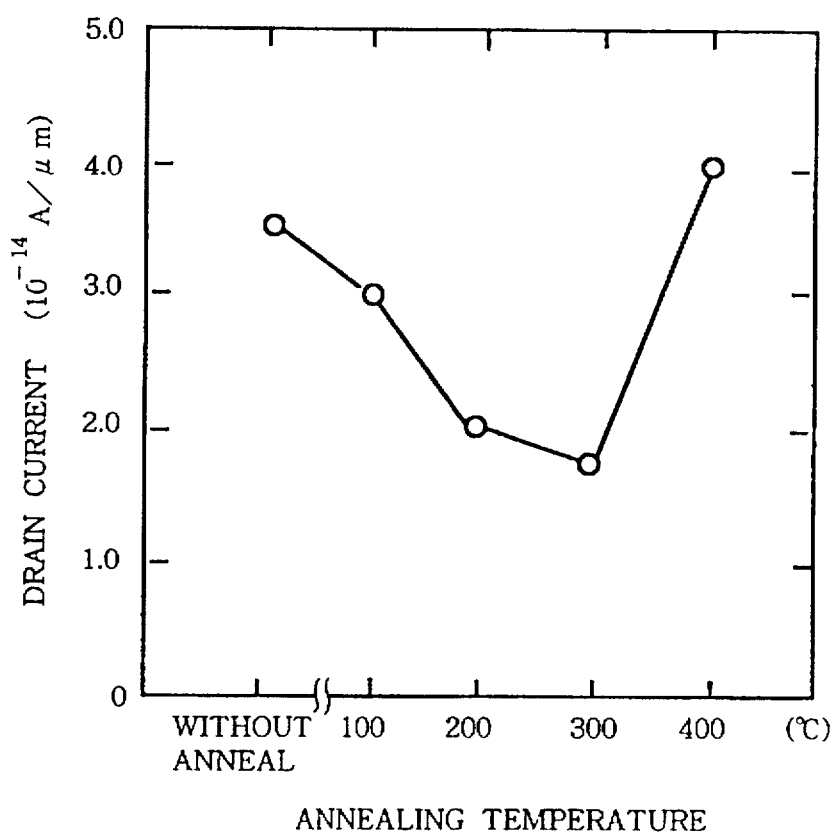
FIG. 4 is a graph showing the drain current of a field effect transistor in off-state in terms of the temperature in a post-annealing.
Figure 5:
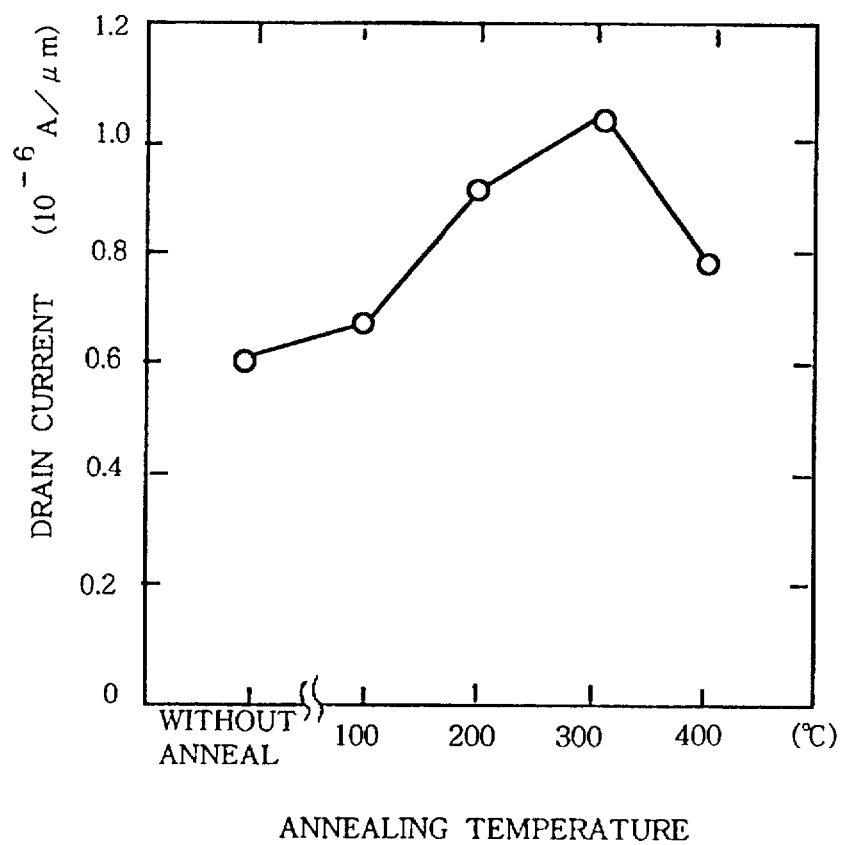
FIG. 5 is a graph showing the drain current of the field effect transistor in on-state in terms of the temperature in the post-annealing.

As will be understood from FIGS. 4 and 5, the post annealing between 200 degrees and 300 degrees centigrade effectively decreases the drain current in the off state, and increases the drain current in the on-state. Especially, the post annealing around 300 degrees centigrade drastically improves the drain current in the on-state and the off-state.

The improvement of transistor characteristics is derived from the following phenomena. First, the elimination of hydrogen from the trap levels is minor in the post-annealing between 200 degrees to 300 degrees centigrade. On the contrary, the post-annealing promotes the diffusion into the non-single crystal silicon layer 12 and the bond between the hydrion and the trapping levels.

Although the drain current in the on-state was decreased after the post-annealing around 400 degrees centigrade, the drain current in the off-state was increased. This phenomenon is derived from that the elimination of hydrogen from the trap levels becomes major around 400 degrees centigrade.

The present inventor further studied time dependence of the transistor characteristics after the post-annealing. Although the transistor characteristics were changed with time after the post-annealing around 400 degrees centigrade, the variation of the transistor characteristics after the post-annealing between 200 degrees and 300 degrees centigrade was negligible.

The present inventor further confirmed that the elimination of hydrogen in the post-annealing was promoted when the pressure was decreased. Therefore, it is preferable to carry out the post-annealing at the atmospheric pressure.

The temperature dependency of the semiconductor structure became clear when the hydrogen treatment was carried out at 300 degrees centigrade or more. This was because of the fact that the mobility of hydrion was drastically increased in the non-single crystal silicon layer 12. For this reason, the hydrogen treatment is carried out at least 300 degrees centigrade. If the metal wiring strips 19a/19b is formed of aluminum or aluminum alloy, it is necessary to restrict heat treatment thereafter not higher than 400 degrees centigrade. In view of the material for the metal wiring strips 19a/19b, the hydrogen treatment should be carried out at 400 degrees centigrade or less.

As will be appreciated from the foregoing description, the residual hydrogen is evacuated from the semiconductor device during the post-annealing at 200 degrees to 300 degrees centigrade, and the post-annealing enhances the stability of the non-single crystal thin film transistor and the other component transistors.

Second Embodiment

Turning to FIGS. 6A to 6F of the drawings, another process embodying the present invention starts with preparation of a p-type silicon substrate 30. Circuit components of an integrated circuit such as n-channel enhancement type switching transistors are formed on the p-type silicon substrate 30. An insulating layer 31 is deposited over the circuit components to 100 nanometers to 1000 nanometers thick. The p-type silicon substrate 30 covered with the insulating layer 31 is replaceable with an insulating substrate.

Polysilicon is deposited to 50 nanometers to 200 nanometers thick over the insulating layer 31 through a low-pressure chemical vapor deposition, and the insulating layer 30 is overlain by a polysilicon layer. Dopant impurity such as phosphorous or boron is introduced into the polysilicon layer by using a thermal diffusion or an ion-implantation.

Figure 6A:
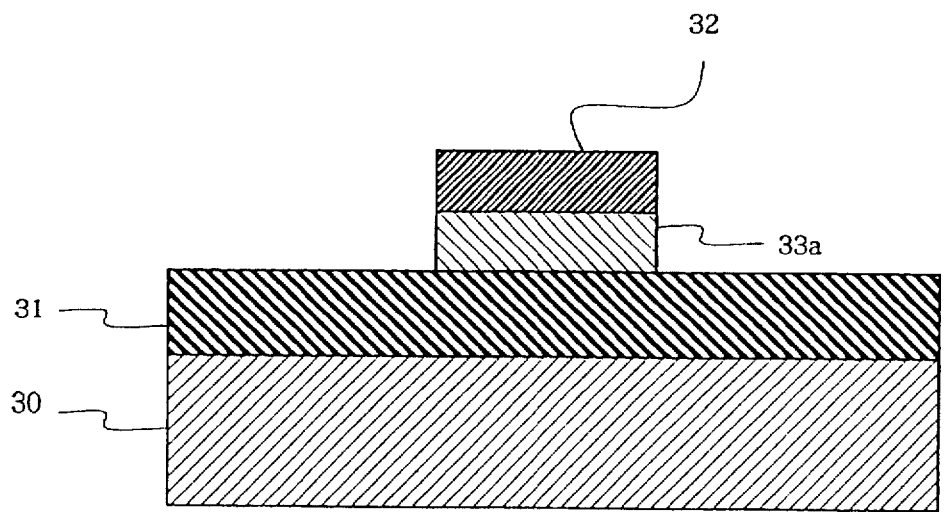
FIGS. 6A to 6F are cross sectional views showing another process of fabricating a semiconductor device according to the present invention.

Photo-resist solution is spun onto the doped polysilicon layer, and is dried and baked so as to form a photo-resist layer (not shown) on the doped polysilicon layer. An image for a gate electrode is optically transferred from a photo mask to the photo-resist layer, and a latent image is formed therein. When the latent image is developed, the photo-resist layer is patterned into a photo-resist etching mask 32. Using the photo-resist etching mask, the doped polysilicon layer is partially removed, and a gate electrode 33a is left on the insulating layer 31 as shown in FIG. 6A.

The photo-resist etching mask 32 is stripped off, and the gate electrode 33a becomes uncovered. Insulating material such as silicon oxide is grown to about 20 nanometers over the entire surface of the semiconductor structure by using a thermal oxidation or a low-pressure chemical vapor deposition, and an insulating layer 34 topographically extends on the insulating layer 31 and the gate electrode 33a. A part of the insulating layer on the upper surface of the gate electrode serves as a gate insulating layer 34a.

Figure 6B:
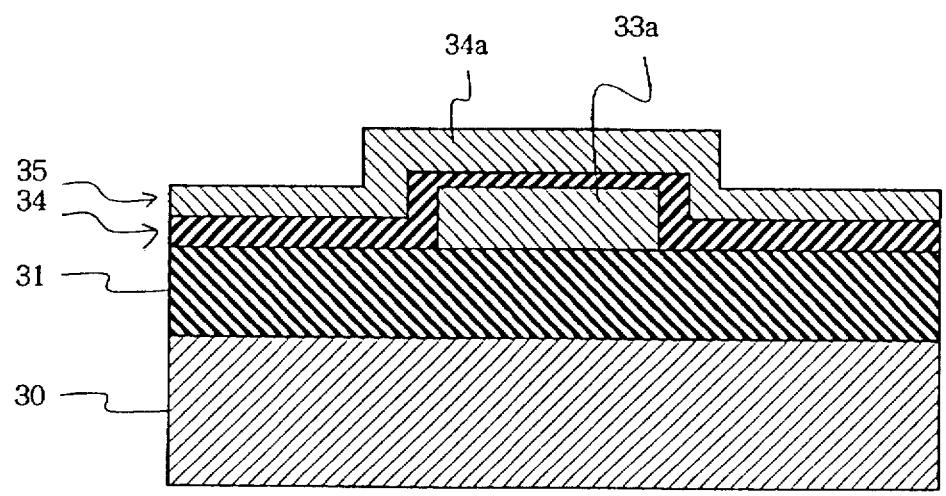

Subsequently, amorphous silicon is deposited to 10 nanometers to 100 nanometers thick over the insulating layer 34 by using a low-pressure chemical vapor deposition, and an amorphous silicon layer topographically extends over the insulating layer 34. The amorphous silicon layer is annealed around 600 degrees centigrade, and is converted to a polysilicon layer. N-type dopant impurity is ion implanted into the polysilicon layer, and the polysilicon layer is converted to a lightly doped polysilicon layer 35. The dopant concentration falls within the range between $10^{16}$ cm$^{-3}$ and $10^{18}$ cm$^{-3}$. The lightly doped polysilicon layer 35 or a non-single crystal silicon layer 35 is patterned through the lithographic techniques and the dry etching. The resultant semiconductor structure is shown in FIG. 6B.

Figure 6C:
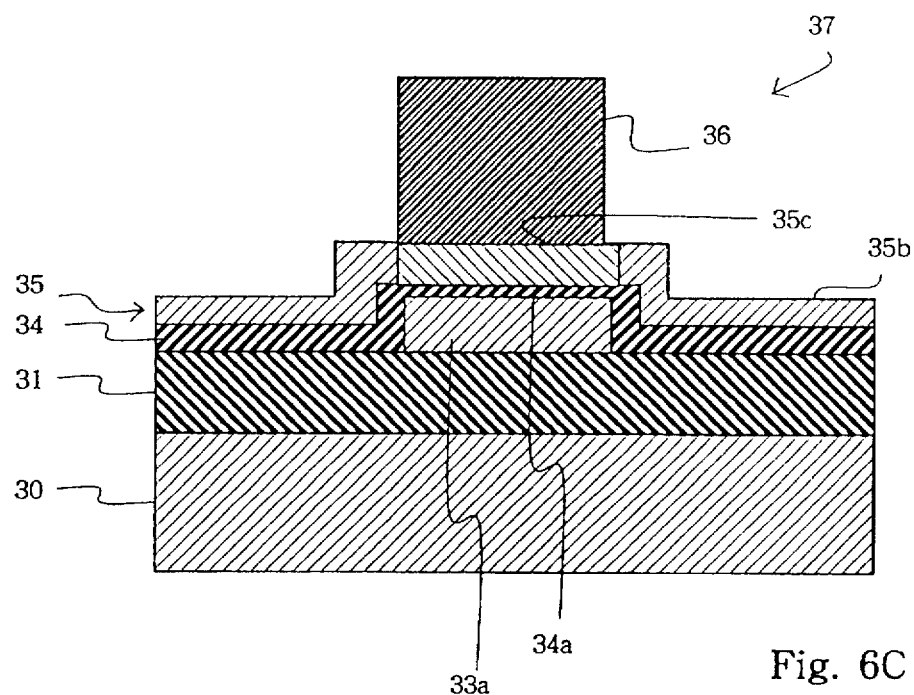

A photo-resist mask 36 is formed over the gate electrode 33a through lithographic techniques, and p-type dopant impurity such as boron is ion implanted into the lightly doped polysilicon layer 35. The p-type dopant impurity forms a p-type source region 35a and a p-type drain region 35b in the lightly doped polysilicon layer 35, and a channel region 35c remains p-type as shown in FIG. 6C. The dopant concentration in hte p-type source/drain regions 35a/35b is regulated to $10^{19}$ cm$^{-3}$ to $10^{21}$ cm$^{-3}$. If the ion-implantation of p-type dopant impurity is repeated after formation of a photo-resist mask, the p-type source region 35a and the p-type drain region 35b have the LDD structure.

The photo-resist mask 36 is stripped off. The gate electrode 33a, the gate insulating layer 34a, the p-type source region 35a, the p-type drain region 35b, the channel region 35c as a whole constitute a non-single crystal thin film transistor 37.

Subsequently, insulating substance is deposited over the non-single crystal thin film transistor 37 to 300 nanometers thick, and an inter-level insulating layer 38 covers the non-single crystal thin film transistor 37 and an exposed area of the insulating layer 34. It is preferable that undoped insulating material forms the boundary with the doped polysilicon layer 35.

The inter-level insulating layer 38 is reflowed at 800 degrees to 1100 degrees centigrade, and the p-type dopant impurity in the source/drain regions 35a/35b is activated during the heat treatment.

Subsequently, a photo-resist etching mask (not shown) is formed on the inter-level insulating layer 38 by using the lithographic techniques, and the inter-level insulating layer 38 is partially removed so as to form contact holes 39a/39b. The p-type source region 35a and the p-type drain region 35b are respectively exposed to the contact holes 39a/39b.

Metal such as aluminum or aluminum alloy is deposited over the entire surface. The metal fills the contact holes 39a/39b, and swells into a metal layer on the inter-level insulating layer 38. A photo-resist etching mask (not shown) is provided on the metal layer, and the metal layer is partially etched away. As a result, a source electrode 40a and a drain electrode 40b are left in the contact holes 39a/39b as shown in FIG. 6D.

Figure 6D:
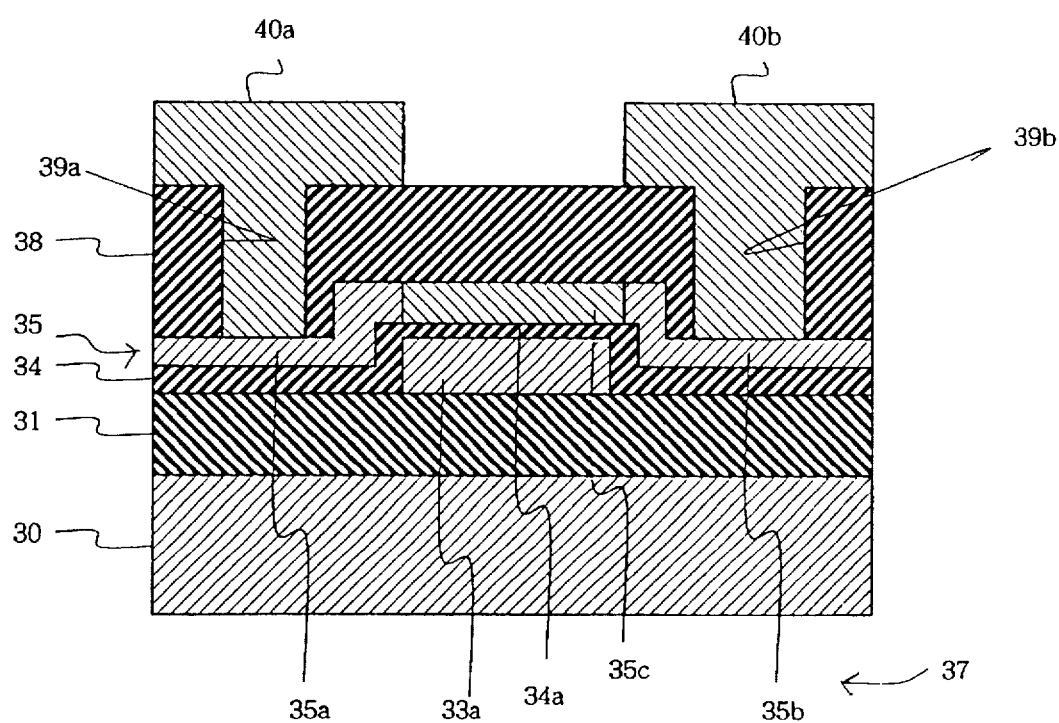

The resultant semiconductor structure shown in FIG. 6D is placed on the suceptor 20c of the diode parallel plate plasma chemical vapor deposition system 20, and the hydrogen treatment and the post-annealing are carried out in the reaction chamber 20a.

Figure 6E:
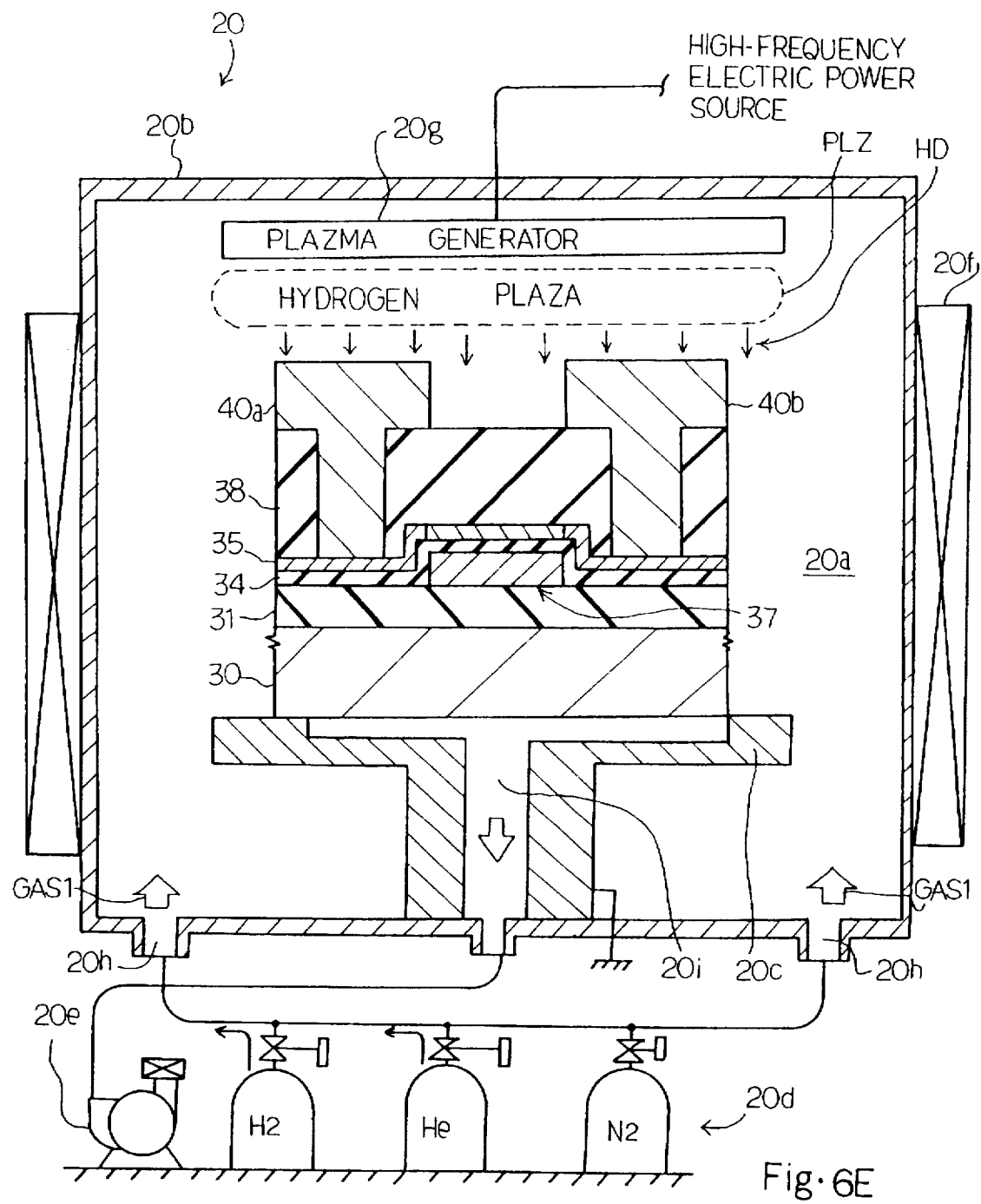

The semiconductor structure is exposed to hydrogen plasma PLZ at 300 degrees to 400 degrees centigrade for 10 minutes, and, thereafter, the semiconductor structure is quenched to the room temperature as similar to the first embodiment. While the semiconductor structure is being exposed to the hydrogen plasma PLZ as shown in FIG. 6E, hydrogen ion HD is taken into the semiconductor structure, and is diffused to the non-single crystal silicon layer 35. The hydrogen ion is captured by trapping levels and surface states in the non-single crystal silicon layer 35, and deactivates the trapping levels and the surface states.

Figure 6F:
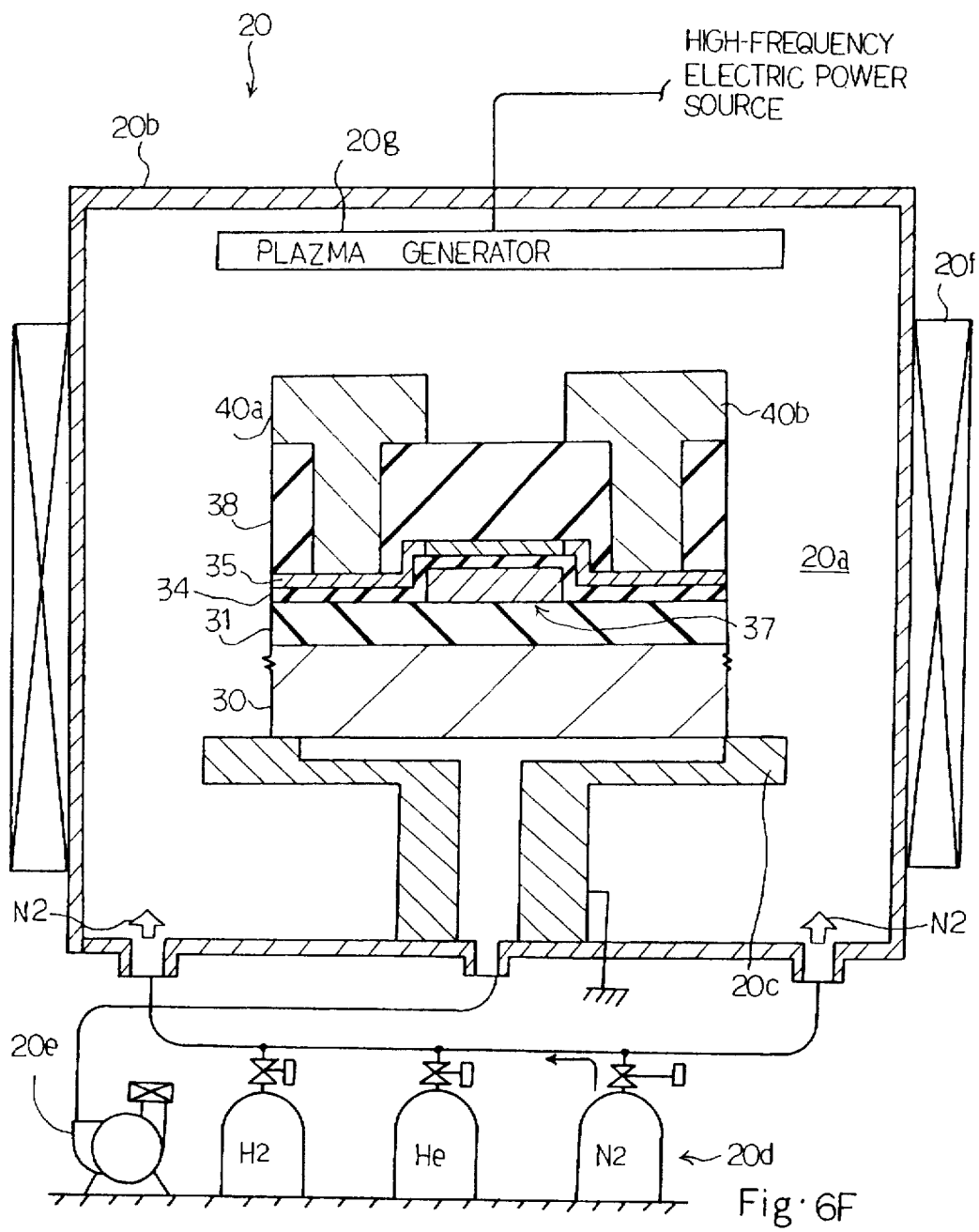

Subsequently, the semiconductor structure is heated to 200 degrees to 300 degrees centigrade the nitrogen atmosphere as shown in FIG. 6F, and is maintained in the high-temperature nitrogen atmosphere for 60 minutes. After the post-annealing, the semiconductor structure is cooled to the room temperature, again. The post-annealing diffuses residual hydrogen partially to the non-single crystal silicon layer 35 and partially to the reaction chamber 20a. The residual hydrogen are bonded to remaining trapping levels and remaining surface states, and further improves the transistor characteristics of the non-single crystal thin film transistor 37.

In this instance, the hydrogen treatment and the post-annealing are carried out after the patterning step of the source and drain electrodes 40a/40b. A modified process carries out the hydrogen treatment and the post-annealing before the formation of the source and drain electrodes 40a/40b. Even though the hydrogen treatment and the post-annealing are carried out before the formation of the source/drain electrodes 40a/40b, the semiconductor structure should be prevented from high-temperature ambience over 400 degrees centigrade, because the elimination of hydrogen from the trap levels takes place in such high temperature environment. The high-temperature ambience further promotes the reaction between aluminum and the silicon substrate 30, and the reaction deteriorates the diffused region formed in the silicon substrate 30 due to aluminum spikes.

Third Embodiment

Figure 7:
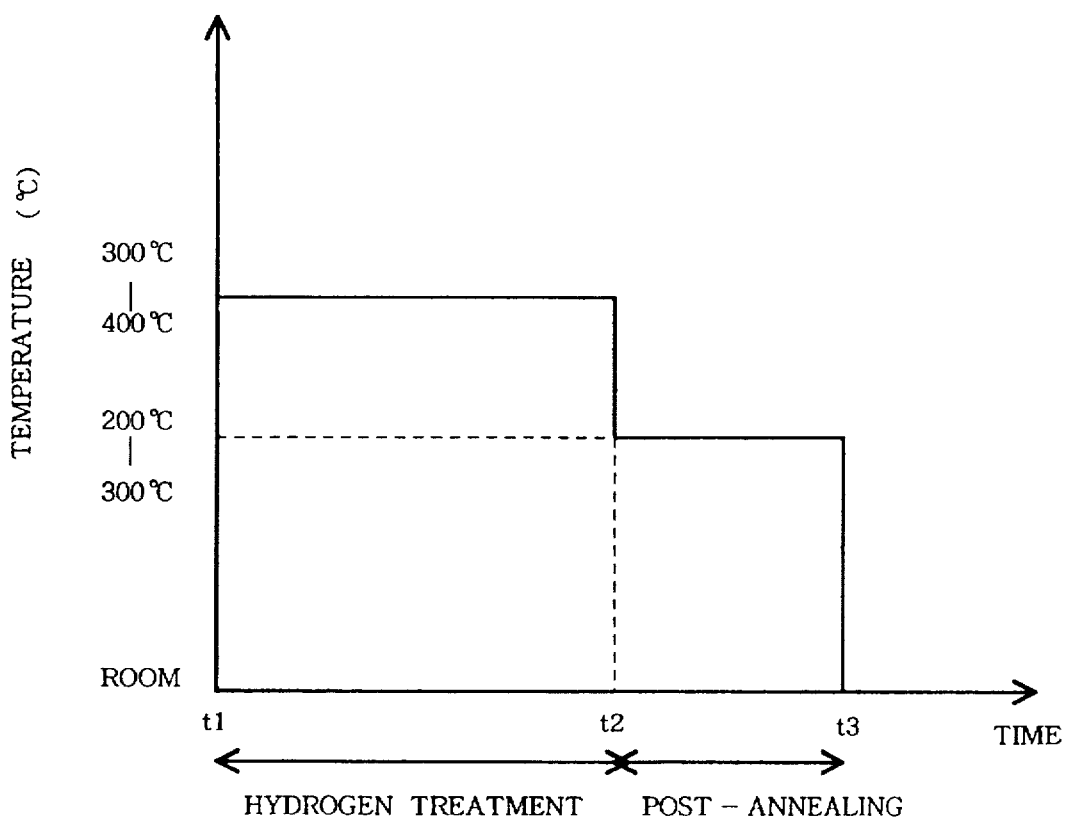
FIG. 7 is a graph showing a post-annealing carried out in yet another process of fabricating a semiconductor device according to the present invention.

Yet another process embodying the present invention is similar to the first embodiment or the second embodiment except for the hydrogen treatment and the post-annealing. For this reason, description is made on these two steps with reference to FIG. 7.

The hydrogen treatment and the post-annealing are successively carried out without a quench to room temperature. In detail, a semiconductor structure is exposed to hydrogen plasma at 300 degrees to 400 degrees centigrade from time t1 to time t2, and is quenched to 200 degrees to 300 degrees centigrade at time t2. The time period between time t1 and time t2 ranges from 5 minutes to 120 minutes.

Subsequently, the semiconductor structure is annealed in nitrogen at 200 degrees to 300 degrees centigrade from time t2 to time t3. The time period between t2 and t3 ranges from 5 minutes to 120 minutes. Although the hydrogen treatment is carried out in vacuum, it is preferable to carry out the post-annealing under the atmospheric pressure.

In this instance, a plasma chamber and an annealing chamber are separately prepared, and the semiconductor structure is quickly removed from the plasma chamber to the annealing chamber.

The process implementing the third embodiment achieves all the advantages of the first embodiment. An additional advantage of the third embodiment is shortening of the process time. In fact, the process time of the third embodiment is reduced at 20 percent to 30 percent with respect to the process time of the first embodiment.

Fourth Embodiment

Figure 8:
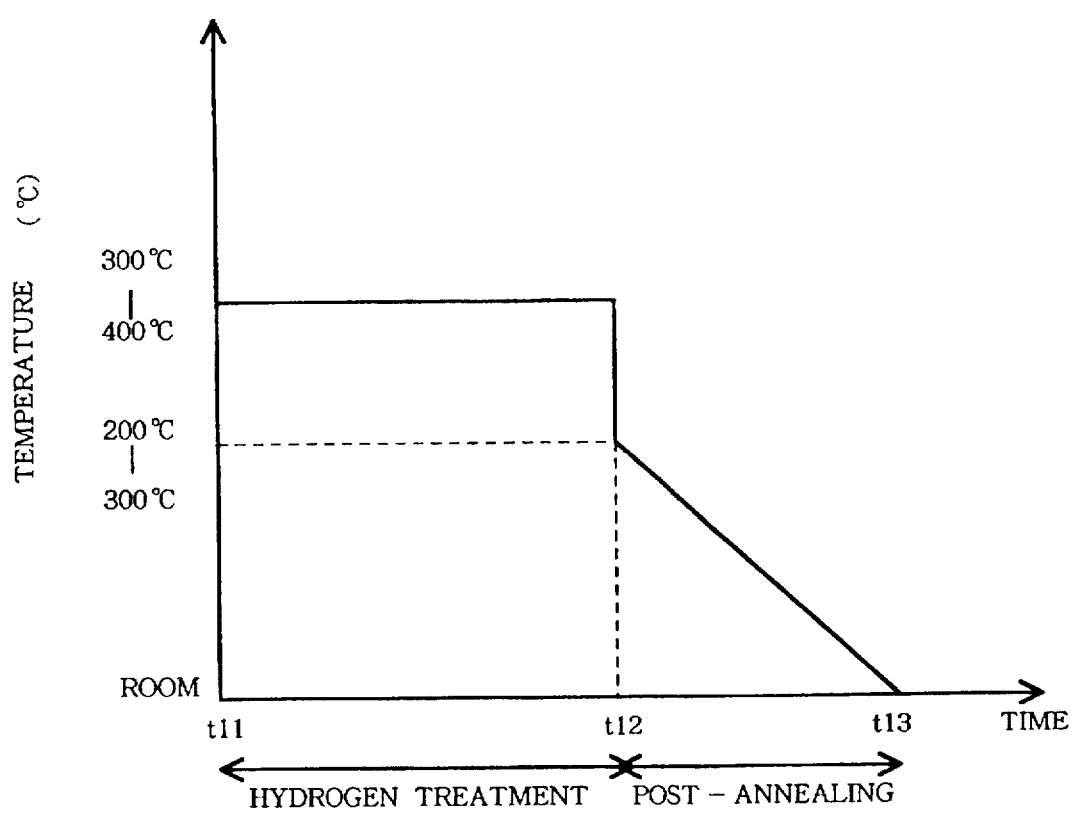
FIG. 8 is a graph showing a post-annealing carried out in still another process of fabricating a semiconductor device according to the present invention.

Still another process embodying the present invention is similar to the first embodiment or the second embodiment except for the hydrogen treatment and the post-annealing. For this reason, description is made on these two steps with reference to FIG. 8.

The hydrogen treatment and the post-annealing are successively carried out without a quench to room temperature. In detail, a semiconductor structure is exposed to hydrogen plasma at 300 degrees to 400 degrees centigrade from time t11 to time t12, and is quenched to 200 degrees to 300 degrees centigrade at time t12. The time period between time t1 and time t2 ranges from 5 minutes to 120 minutes.

Subsequently, the semiconductor structure is annealed in nitrogen at atmospheric pressure, and the temperature is gradually decreased from time t12 to time t13. The cooling speed is regulated in such a manner as to diffuse residual hydrogen to the annealing chamber and the non-single crystal silicon layer. In this instance, the cooling speed is regulated to about 10 degrees per minute.

The process implementing the fourth embodiment achieves all the advantages of the first embodiment.

Applicable Semiconductor Devices

The non-single crystal thin film transistor according to the present invention is available for a semiconductor static random access memory device. A typical static random access memory cell includes a flip-flop type latch circuit and a pair of access transistors coupled between the latch circuit and a pair of bit line pair, and two series combinations of load elements and switching transistors form the flip-flop type latch circuit. The non-single crystal thin film transistor is preferable to the load elements. In this instance, the non-single crystal thin film transistors are fabricated over a semiconductor substrate.

Another applicable device is an active matrix type liquid crystal display. The non-single crystal thin film transistors are arrayed on a transparent glass substrate, and are connected between signal lines and pixels. In this instance, the non-single crystal thin film transistors are fabricated on an insulating substrate.

As will be appreciated from the foregoing description, the post-annealing diffuses residual hydrogen to annealing ambience and the non-single crystal semiconductor layer. The residual hydrogen further deactivates the trapping level and the surface state levels, and the transistor characteristics becomes more stable. In fact, the non-single crystal thin film transistor fabricated through the prior art process has a hydrogen content between $10^{17}$ cm$^{-3}$ and $10^{18}$ cm$^{-3}$ in the non-single crystal semiconductor layer. On the other hand, the process according to the present invention increases the hydrogen content to $10^{18}$ cm$^{-3}$ to $10^{19}$ cm$^{-3}$. The large amount of hydrogen improves the transistor characteristics. The drain current in the off-state is decreased to a half of that of the prior art thin film transistor, and the drain current in the on-state is one and half times increased rather than that of the prior art thin film transistor.

Although particular embodiments of the present invention have been shown and described, it will be obvious to those skilled in the art that various changes and modifications may be made without departing from the spirit and scope of the present invention.

The non-single crystal thin film transistor may be an n-channel type.

The treatment with the hydrogen plasma and the evacuation of the residual hydrogen may be carried out after the coverage of the non-single crystal thin film transistor with the inter-level insulating layer.

The post-annealing may be carried out in another inert atmosphere such as helium gas or argon gas.

What is claimed is:

1. A process of fabricating a semiconductor device, comprising the steps in sequence of:
    a) providing a structure having an upper surface covered with a first insulating layer;
    b) fabricating a thin film transistor having a non-single crystal semiconductor layer on said first insulating layer;
    c) completing a semiconductor structure having at least a second insulating layer covering said thin film transistor;
    d) exposing said semiconductor structure to hydrogen ion radiated from plasma created from gaseous mixture containing hydrogen at 300 degrees to 400 degrees centigrade so as to deactivate trapping levels in said non-single crystal semiconductor layer; and
    e) evacuating residual hydrogen from said semiconductor structure except for said non-single crystal semiconductor layer at 200 degrees to 300 degrees centigrade.

2. The process as set forth in claim 1, and including the step of cooling said semiconductor structure to room temperature between said step d) and said step e).

3. The process as set forth in claim 2 wherein said semiconductor structure is exposed to said hydrogen ion for a first time period of between 5 minutes and 120 minutes in said step d), and said semiconductor structure is maintained at 200 degrees to 300 degrees centigrade for a second time period of between 5 minutes and 120 minutes in said step e).

4. The process as set forth in claim 3, in which said step e) is carried out in an inert atmosphere.

5. The process as set forth in claim 4, in which said inert atmosphere comprises nitrogen at atmospheric pressure.

6. The process as set forth in claim 1, in which said semiconductor structure is cooled to 200 degrees to 300 degrees centigrade upon completion of said step d), and said semiconductor structure is maintained at 200 degrees to 300 degrees centigrade in said step e) without cooling to room temperature.

7. The process as set forth in claim 6, in which said step e) is carried out in an inert atmosphere.

8. The process as set forth in claim 7, in which said inert atmosphere comprises nitrogen at atmospheric pressure.

9. The process as set forth in claim 1, in which said semiconductor structure is rapidly cooled to 200 degrees to 300 degrees centigrade upon completion of exposure to said hydrogen ion in said step d), and said semiconductor structure is gradually cooled from 200 degrees to 300 degrees centigrade to room temperature in said step e).

10. The process as set forth in claim 9, in which said step e) is carried out in an inert atmosphere.

11. The process as set forth in claim 10, in which said inert atmosphere comprises nitrogen at atmospheric pressure.

12. The process as set forth in claim 1, in which said step b) includes the sub-steps in sequence of
    b-1) forming said non-single crystal semiconductor layer on said first insulating layer,
    b-2) growing a third insulating layer partially serving as a gate insulating layer on said non-single crystal semiconductor layer,
    b-3) forming a gate electrode on said gate insulating layer, and
    b-4) introducing a dopant impurity into said non-single crystal semiconductor layer in a self-aligned manner with said gate electrode so as to form a source region and a drain region on both sides of a channel region beneath said gate insulating layer.

13. The process as set forth in claim 1, in which said step b) includes the sub-steps in sequence of
    b-1) forming a gate electrode on said first insulating layer,
    b-2) growing a third insulating layer covering said gate electrode and partially serving as a gate insulating layer,
    b-3) forming said non-single crystal semiconductor layer extending over said gate insulating layer, and
    b-4) selectively introducing a dopant impurity into said non-single crystal semiconductor layer on both sides of a part of said non-single crystal semiconductor layer serving as a channel region over said gate electrode, thereby forming a source region and a drain region.

* * * * *